(12) United States Patent
Choi

(10) Patent No.: US 12,543,444 B2
(45) Date of Patent: Feb. 3, 2026

(54) EMISSIVE DISPLAY DEVICE WITH SEPARATION LINE BETWEEN PIXELS

(71) Applicant: Samsung Display Co., LTD., Yongin-si (KR)

(72) Inventor: Sang-Hyun Choi, Seoul (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 554 days.

(21) Appl. No.: 17/864,045

(22) Filed: Jul. 13, 2022

(65) Prior Publication Data
US 2023/0157082 A1 May 18, 2023

(30) Foreign Application Priority Data
Nov. 15, 2021 (KR) .................. 10-2021-0156576

(51) Int. Cl.
*H10K 59/122* (2023.01)
*H10K 50/15* (2023.01)
(Continued)

(52) U.S. Cl.
CPC .......... *H10K 59/122* (2023.02); *H10K 50/15* (2023.02); *H10K 50/16* (2023.02); *H10K 59/131* (2023.02); *H10K 2102/101* (2023.02)

(58) Field of Classification Search
CPC ...... H10K 59/122; H10K 50/15; H10K 50/16; H10K 59/131; H10K 2102/101; H10K 59/80522; H10K 50/19; H10K 59/124
See application file for complete search history.

(56) References Cited

U.S. PATENT DOCUMENTS

2011/0108842 A1* 5/2011 Yamazaki ............ H10H 29/142
257/E33.053
2018/0145118 A1* 5/2018 Kim ..................... H10K 59/122
(Continued)

FOREIGN PATENT DOCUMENTS

KR  10-2011-0095653  8/2011
KR  10-1218227      1/2013
(Continued)

OTHER PUBLICATIONS

Korean Office Action dated Sep. 19, 2025 issued in Korean Patent Application No. 10-2021-0156576.

*Primary Examiner* — Jacob Y Choi
*Assistant Examiner* — Grace Cha
(74) *Attorney, Agent, or Firm* — Harness, Dickey & Pierce, P.L.C.

(57) ABSTRACT

An emissive display device includes a transistor disposed on a substrate, a first insulating layer on the transistor, a separation line disposed on the first insulating layer, a second insulating layer on the first insulating layer, the second insulating layer including a first opening overlapping the separation line, a first and second pixel electrodes on the second insulating layer at opposite sides of the separation line, a pixel defining layer on the second insulating layer, and an emission member on the first and second pixel electrodes, the pixel defining layer, and the separation line. The pixel defining layer includes a second opening overlapping the separation line. The emission member is separated by the separation line. The emission member includes a first emission unit, a charge generating layer on the first emission unit, and a second emission unit on the charge generating layer.

20 Claims, 15 Drawing Sheets

(51) Int. Cl.
*H10K 50/16* (2023.01)
*H10K 59/131* (2023.01)
*H10K 102/10* (2023.01)

(56) References Cited

U.S. PATENT DOCUMENTS

| | | | |
|---|---|---|---|
| 2019/0006436 A1* | 1/2019 | Gong | G09G 3/3258 |
| 2019/0006613 A1* | 1/2019 | Bang | H10K 59/1213 |
| 2019/0172899 A1* | 6/2019 | Kim | H10K 59/123 |
| 2021/0167161 A1* | 6/2021 | Yang | H10K 59/353 |
| 2021/0202655 A1 | 7/2021 | Cho et al. | |
| 2021/0376283 A1* | 12/2021 | Shin | H10K 59/124 |
| 2022/0246698 A1 | 8/2022 | Kim et al. | |

FOREIGN PATENT DOCUMENTS

| | | |
|---|---|---|
| KR | 10-2016-0016339 A | 2/2016 |
| KR | 10-2016-0072010 A | 6/2016 |
| KR | 10-2017-0063326 | 6/2017 |
| KR | 10-2019-0003239 A | 1/2019 |
| KR | 10-2019-0003240 | 1/2019 |
| KR | 10-2019-0066649 A | 6/2019 |
| KR | 10-2021-0083702 A | 7/2021 |
| KR | 10-2021-0086869 A | 7/2021 |
| KR | 10-2022-0111814 | 8/2022 |

* cited by examiner

EMISSIVE DISPLAY DEVICE WITH SEPARATION LINE BETWEEN PIXELS

CROSS-REFERENCE TO RELATED APPLICATION(S)

This application claims priority to and benefits of Korean Patent Application No. 10-2021-0156576 under 35 U.S.C. § 119, filed on Nov. 15, 2021, in the Korean Intellectual Property Office, the entire contents of which are incorporated herein by reference.

BACKGROUND

1. Technical Field

The disclosure relates to an emissive display device including light emitting diodes.

2. Description of the Related Art

An emissive display device may include light emitting diodes (LEDs) corresponding to pixels, and may display an image by controlling luminance of each of the light emitting diodes. Unlike a non-emissive display devices such as a liquid crystal displays, the emissive display devices may not require a separate light sources, making it possible to reduce their thickness and weight. The emissive display devices have characteristics such as high luminance, high contrast ratio, high color reproduction, high response speed, and the like, to display a high quality image.

Because of such advantages, the emissive display devices are applied to various electronic devices including mobile devices such as smart phones and tablets, monitors, televisions, and the like, and have been a focus of interest as display devices for vehicles.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An emissive display device may include a pixel electrode, an emission member, and a common electrode constituting a light emitting diode. The emission member may include multiple layers, and at least some of the layers may span over multiple pixels. Accordingly, the electric current supplied to a pixel may leak to a neighboring pixel, and cause the neighboring pixel to unintentionally emit light or increase its luminance.

Embodiments provide an emissive display device that prevents such leakage of light from occurring between neighboring pixels.

An embodiment provides an emissive display device that may include a transistor disposed on a substrate, a first insulating layer disposed on the transistor, a separation line disposed on the first insulating layer, a second insulating layer disposed on the first insulating layer the second insulating layer including a first opening overlapping the separation line in a plan view, a first pixel electrode and a second pixel electrode disposed at opposite sides of the separation line, the first pixel electrode and the second pixel electrode disposed on the second insulating layer, a pixel defining layer disposed on the second insulating layer, the pixel defining layer including a second opening overlapping the separation line in a plan view, and an emission member disposed on the first pixel electrode, the second pixel electrode, the pixel defining layer, and the separation line, the emission member being separated by the separation line. The emission member may include a first emission unit, a charge generating layer disposed on the first emission unit, and a second emission unit disposed on the charge generating layer.

The charge generating layer may include an n-type charge generating layer and a p-type charge generating layer. The charge generating layer may be separated at opposite sides of the separation line.

The charge generating layer may have a portion disposed on the separation line.

The separation line may include a first conductive layer, a second conductive layer, and a third conductive layer. The first conductive layer, the second conductive layer, and the third conductive layer may be sequentially stacked. The common electrode may electrically contact a side surface of the first conductive layer.

The common electrode may electrically contact a side surface of the second conductive layer.

The separation line may include a first conductive layer, a second conductive layer, and a third conductive layer. The first conductive layer, the second conductive layer, and the third conductive layer may be sequentially stacked. A width of the third conductive layer may be wider than a width of the second conductive layer.

The third conductive layer may include a transparent conductive oxide layer.

The third conductive layer may include a first transparent conductive oxide layer, a metal layer, and a second transparent conductive oxide layer. The first transparent conductive oxide layer, the metal layer, and the second transparent conductive oxide layer may be sequentially stacked.

The third conductive layer, the first pixel electrode, and the second pixel electrode may include a same material and may be formed in a same process.

The emissive display device may further include a connector disposed on the first insulating layer, the connector being an electrode of the transistor, or the connector being electrically connected to the electrode of the transistor. The connector may include a first conductive layer, a second conductive layer, and a third conductive layer. The first conductive layer, the second conductive layer, and the third conductive layer may be sequentially stacked. The first conductive layer of the separation line and the second conductive layer of the separation line, and the first conductive layer of the connector and the second conductive layer of the connector may include a same material. The third conductive layer of the separation line and the third conductive layer of the connector may include a different material.

The second conductive layer of the separation line may be thinner than the second conductive layer of the connector.

The pixel defining layer may have an opening overlapping the connector in a plan view. The first pixel electrode may be connected to the connector through the opening of the pixel defining layer.

Each of the first emission unit and the second emission unit may include a hole transport layer, an electron transport layer disposed on the hole transport layer, and a first emission layer overlapping the first pixel electrode in a plan view, the first emission layer disposed between the hole transport layer and the electron transport layer, and a second emission layer overlapping the second pixel electrode in a plan view, the second emission layer disposed between the hole transport layer and the electron transport layer.

The emissive display device may further include a common electrode disposed on the light emitting member. The common electrode may be separated by the separation line.

The separation line may include a first conductive layer, a second conductive layer, and a third conductive layer. The first conductive layer, the second conductive layer, and the third conductive layer may be sequentially stacked. The common electrode may electrically contact a side surface of the second conductive layer.

The common electrode may have a portion disposed on the separation line.

An embodiment provides an emissive display device that may include a transistor disposed on a substrate, a first insulating layer disposed on the transistor, a bypass line disposed on the first insulating layer, a second insulating layer disposed on the first insulating layer, the second insulating layer including an opening overlapping the bypass line in a plan view, a first pixel electrode and a second pixel electrode disposed at opposite sides of the bypass line, the first pixel electrode and the second pixel electrode disposed on the second insulating layer, a pixel defining layer disposed on the second insulating layer, the pixel defining layer including an opening overlapping the bypass line in a plan view; a emission member disposed on the first pixel electrode, the second pixel electrode, the pixel defining layer, and the bypass line, and a common electrode disposed on the emission member. The emission member may extend over the first pixel electrode and the second pixel electrode. A surface of the emission member may contact a surface of the bypass line.

A voltage applied to the common electrode may be substantially equal to a voltage applied to the bypass line.

The bypass line may include a first conductive layer, a second conductive layer, and a third conductive layer. The first conductive layer, the second conductive layer, and the third conductive layer may be sequentially stacked. The third conductive layer may include a transparent conductive oxide layer.

The emission member may contact the third conductive layer. The third conductive layer, the first pixel electrode, and the second pixel electrode may include a same material, and may be formed in a same process.

According to the embodiments, it is possible to prevent leakage of light from occurring between neighboring pixels, thereby improving display quality of the emissive display device. Further, according to the embodiments, other advantages may be apparent throughout the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
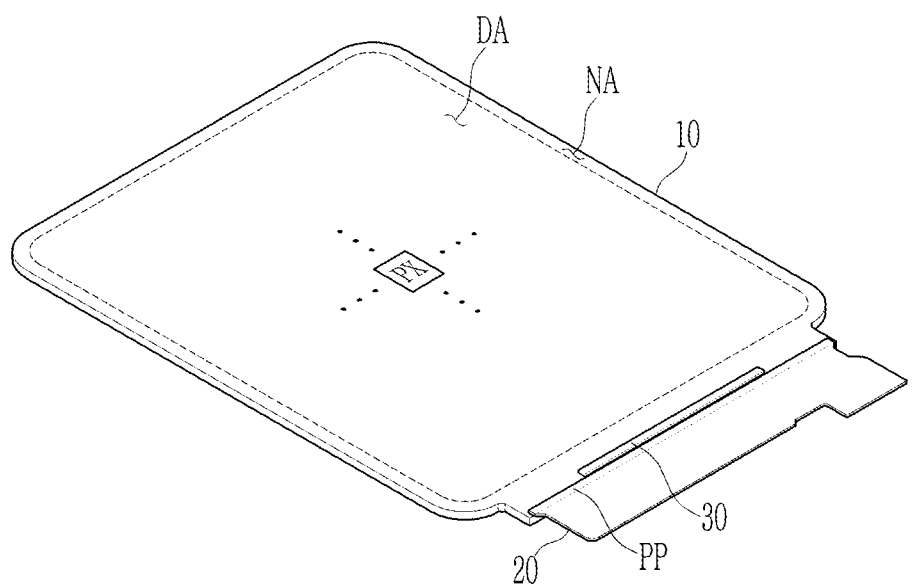
FIG. 1 illustrates a schematic perspective view showing an emissive display device according to an embodiment.

The disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise" and variations such as "comprises" or "comprising" will be understood to imply the inclusion of stated elements but not the exclusion of any other elements.

It will be understood that when an element (or a region, a layer, a portion, a surface, or the like) is referred to as "being on," "connected to," "contacting," or "coupled to" another element in the specification, it can be directly disposed on, connected, contacting, or coupled to another element mentioned above, or intervening elements may be disposed therebetween.

It will be understood that the terms "connected to," "contacting," or "coupled to" may include a physical or electrical connection or coupling.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic perspective view showing an emissive display device according to an embodiment.

Referring to FIG. 1, the emissive display device (hereinafter, simply referred to as a "display device") may include a display panel 10, a flexible printed circuit film 20 bonded to the display panel 10, and a driving device including an integrated circuit chip 30 and the like.

The display panel 10 may include a display area DA corresponding to a screen on which an image is displayed and a non-display area NA, and circuits and/or signal lines for generating and/or transferring various signals and voltages applied to the display area DA are disposed in the non-display area NA. The non-display area NDA may surround a periphery of the display area DA. In FIG. 1, inside and outside of a dotted rectangle correspond to the display area DA and the non-display area NA, respectively.

Pixels PX are disposed in a matrix form in the display area DA of the display panel 10. Signal lines such as a gate line (also referred to as a scan line), a data line, and a driving voltage line may be disposed in the display area DA. A gate line, a data line, a driving voltage line, etc. may be connected to each pixel PX, and each pixel PX may receive a gate signal (also referred to as a scan signal), a data voltage, and a driving voltage (also referred to as a first power voltage or a high potential power voltage) from these signal lines. The pixel PX may be implemented as a light-emitting device such as a light emitting diode.

A touch sensor for detecting a user's touch and/or a non-contact touch may be disposed in the display area DA. Although the display area DA is illustrated as having a substantially rectangular shape, the display area DA may have various shapes such as a polygonal shape, a circular shape, an elliptical shape, and the like.

A pad portion PP with pads for receiving signals from the outside of the display panel 10 may be disposed in the non-display area NA of the display panel 10. The pad portion PP may extend in a first direction x along an edge of the display panel 10. The flexible printed circuit film 20 may be bonded to the pad portion PP, and pads of the flexible printed circuit film 20 may be electrically connected to pads of the pad portion PP.

A driving unit may be disposed in the non-display area NA of the display panel 10 and may generate and/or process various signals for driving the display panel 10. The driving unit may include a data driver for applying a data voltage to the data line, a gate driver for applying a gate signal to the gate line, and a signal controller for controlling the data driver and the gate driver. The pixels PX may receive the data voltage according to a selected timing depending on the gate signal generated by the gate driver. The gate driver may be integrated in the display panel 10, and may be disposed on at least one side of the display area DA. The data driver and the signal controller may be provided as an integrated circuit chip (also referred to as a driving IC chip) 30, and the integrated circuit chip 30 may be mounted in the non-display area NA of the display panel 10. The integrated circuit chip 30 may be mounted on the flexible printed circuit film 20 or the like to be electrically connected to the display panel 10.

Figure 2:
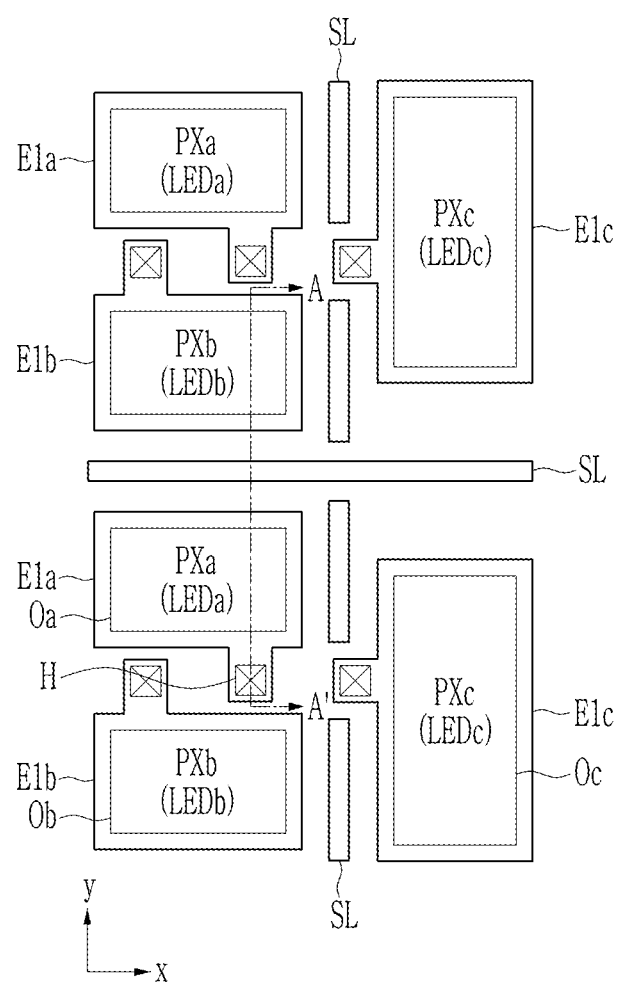
FIG. 2 illustrates a schematic plan view of pixels disposed in a display area in an emissive display device according to an embodiment.
Figure 3:
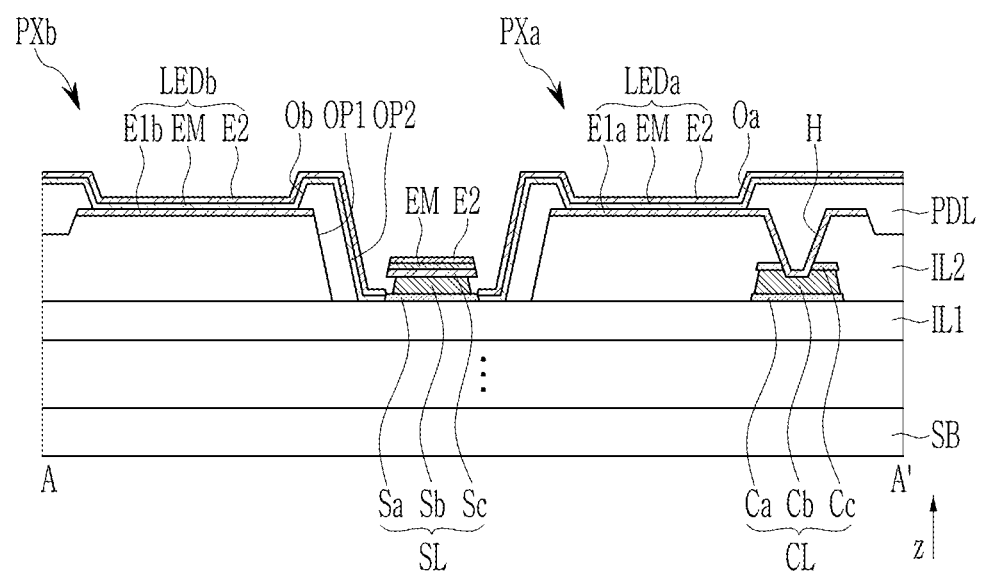
FIG. 3 illustrates a schematic cross-sectional view of an emissive display device taken along line A-A' in FIG. 2 according to an embodiment.

FIG. 2 illustrates a schematic plan view of pixels disposed in a display area in an emissive display device according to an embodiment, and FIG. 3 illustrates a schematic cross-sectional view of an emissive display device taken along line A-A' in FIG. 2 according to an embodiment.

FIG. 2 illustrates pixels PXa, PXb, and PXc disposed in the display area DA of the display panel 10. Although six pixels are illustrated, the pixels PXa, PXb, and PXc may be regularly arranged in a matrix direction in the display area DA. The pixels PXa, PXb, and PXc may include first pixels PXa, second pixels PXb, and third pixels PXc. The first pixel PXa, the second pixel PXb, and the third pixel PXc may display different colors, and each may display one of primary colors. For example, one of the first pixel PXa, the second pixel PXb, and the third pixel PXc may display red, another may display green, and the other may display blue. For example, the first pixel PXa may display red, the second pixel PXb may display green, and the third pixel PXc may display blue.

The first pixels PXa, the second pixels PXb, and the third pixels PXc may be evenly distributed. As illustrated, the first pixel PXa and the second pixel PXb may be alternately and repeatedly disposed along a second direction y. The first and second pixels PXa and PXb and the third pixel PXc may be alternately and repeatedly disposed (or positioned) in a first direction x. In other examples, the arrangement of the pixels PXa, PXb, and PXc may be changed.

A separation line SL may be disposed between the first pixel PXa and the second pixel PXb. The separation line SL may be disposed between the first pixel PXa and the third pixel PXc, and also between the second pixel PXb and the third pixel PXc. The separation line SL may extend in the first direction x or in the second direction y.

Referring to FIG. 2 and FIG. 3, the display panel 10 may include a substrate SB and layers and elements disposed on the substrate SB. For example, an insulating layer IL1 may be disposed on the substrate SB. Although not illustrated, a transistor, a capacitor, etc. for driving the pixels PXa, PXb, and PXc may be disposed between the substrate SB and the insulating layer IL1, and will be described below.

The separation line SL and a connector CL may be disposed on the insulating layer IL1. The separation line SL may be in a floating state or may have a common voltage (also referred to as a second power voltage or a low potential power voltage). The connector CL may be electrically connected to an electrode of the transistor. The connector CL may correspond to an electrode of the transistor.

The separation line SL and the connector CL may each have a multi-layered structure, and may include multiple conductive layers. The separation line SL may include a first conductive layer Sa, a second conductive layer Sb, and a third conductive layer Sc that are sequentially stacked. The connector CL may include a first conductive layer Ca, a second conductive layer Cb, and a third conductive layer Cc that are sequentially stacked. The first conductive layer Sa and the second conductive layer Sb of the separation line SL and the first conductive layer Ca and the second conductive layer Cb of the connector CL may be formed of (may include) a same material, respectively. The third conductive layer Sc of the separation line SL and the third conductive layer Cc of the connector CL may be made of (may include) a different material. For example, the first conductive layers Sa and Ca may be made of a refractory metal such as titanium (Ti), molybdenum (Mo), chromium (Cr), or tantalum (Ta), and the second conductive layers Sb and Cb may be made of a metal having low specific resistance, such as aluminum (Al), copper (Cu), or silver (Ag). The third conductive layer Sc of the separation line SL, the pixel electrodes E1a, E1b, and E1c may be made of (may include) a same material. The third conductive layer of the connector Cc may be made of a refractory metal such as titanium (Ti), molybdenum (Mo), chromium (Cr), or tantalum (Ta). The third conductive layer Sc of the separation line SL may have a multi-layered structure. For example, the third conductive layer Sc may include a triple layer including a transparent conductive oxide layer (a first transparent conductive oxide layer, for example, an indium tin oxide (ITO) layer), a metal layer (e.g., a silver (Ag) layer), and a transparent conductive oxide layer (a second transparent conductive oxide layer, for example, a second ITO layer) that are stacked sequentially.

In the separation line SL, the third conductive layer Sc may be wider than the second conductive layer Sb. In the separation line SL, the side surface of the third conductive layer Sc may protrude compared to the side surface of the second conductive layer Sb. The separation line SL may have an overall reverse tapered structure, in which the width of the third conductive layer Sc is wider than that of the lower second conductive layer Sb. The second conductive layer Sb of the separation line SL may be thinner than the second conductive layer Cb of the connector CL.

An insulating layer IL2 may be disposed on the insulating layer IL1. The insulating layer IL2 may cover a portion of the connector CL, but may not cover the separation line SL. The insulating layer IL2 may have an opening OP1 overlapping the separation line SL, and the width of the opening OP1 may be wider than that of the separation line SL. The opening OP1 may have an elongated trench shape in the longitudinal direction of the separation line SL. The opening OP1 may extend through the insulating layer IL2 in a third direction z.

Pixel electrodes E1a, E1b, and E1c may be disposed on the insulating layer IL2. Each of the pixel electrodes E1a, E1b, and E1c may be electrically connected to the corresponding connector CL through a contact hole H formed in the insulating layer IL2. The adjacent pixel electrodes E1a, E1b, and E1c may be disposed on opposite sides of the separation line SL and the pixel electrodes E1a, E1b, and E1c may be separated from each other.

A pixel defining layer PDL having (or including) openings Oa, Ob, and Oc respectively overlapping the pixel electrodes E1a, E1b, and E1c may be disposed on the insulating layer IL2. The pixel defining layer PDL may cover edges of the pixel electrodes E1a, E1b, and E1c. The pixel defining layer PDL may not cover the separation line SL. The pixel defining layer PDL may have an opening OP2 overlapping the separation line SL, and a width of the opening OP2 may be wider than that of the separation line SL and may be narrower than the width of the opening OP1. The opening OP2 may extend through the pixel defining layer PDL in the third direction z.

An emission member EM may be disposed on the pixel electrodes E1a, E1b, and E1c and the pixel defining layer PDL. The emission member EM may include multiple layers. Some of the layers may be formed as a single layer substantially covering the entire display area DA, and some may be formed as individual layers corresponding to each of the pixel electrodes E1a, E1b, and E1c. A detailed configuration of the emission member EM will be described below. The emission member EM may be disposed on the separation line SL. However, the emission member EM may be separated by the separation line SL having a reverse tapered structure. For example, the emission member EM of the first pixel PXa and the emission member EM of the second pixel PXb may be separated at opposite sides of the separation line SL. Accordingly, current leakage between neighboring pixels through the emission member EM may be prevented, and luminance of a low gray pixel may be prevented from increasing due to a leakage current.

A common electrode E2 may be disposed on the emission member EM. The common electrode E2 may also be disposed on the separation line SL. The common electrode E2 may be separated at opposite sides of the separation line SL by the separation line SL having an inversely tapered structure.

In each of the pixels PXa, PXb, and PXc, the pixel electrodes E1a, E1b, and E1c, the emission member EM, and the common electrode E2 together may comprise the light emitting diodes LEDa, LEDb, and LEDc. The pixel electrodes E1a, E1b, and E1c may be anodes and the common electrode E2 may be a cathode.

A capping layer (refer to FIGS. 13, 14, and 15) may be disposed on the common electrode E2, and an encapsulation layer (refer to FIGS. 13, 14, and 15) may be disposed on the capping layer.

Figure 4:
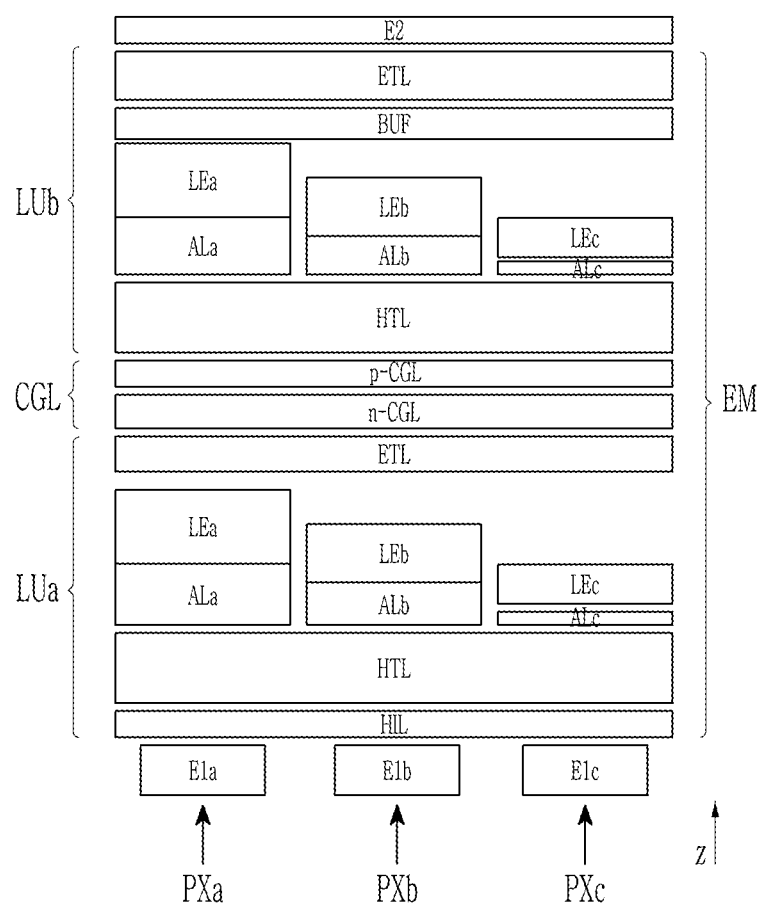
FIG. 4 illustrates a schematic cross-sectional view of an emission member in an emissive display device according to an embodiment.

FIG. 4 illustrates a schematic cross-sectional view of an emission member in an emissive display device according to an embodiment.

Referring to FIG. 4, the stacked structure of the emission member EM of the pixels PXa, PXb, and PXc is illustrated. The emission member EM may be disposed (or positioned) between the pixel electrodes E1a, E1b, and E1c, and the common electrode E2. The emission member EM may include multiple emission units, for example, a first emission unit LUa and a second emission unit LUb. When the display device displays an image, the first emission unit LUa and the second emission unit LUb emit light at the same time, thereby improving the image display characteristic of the display device.

The first emission unit LUa may include a hole injection layer HIL, a hole transport layer HTL, emission layers LEa, LEb, and LEc, and an electron transport layer ETL.

Each of the hole injection layer HIL, the hole transport layer HTL, and the electron transport layer ETL may be formed as a single layer over the pixels PXa, PXb, and PXc. For example, the hole injection layer HIL, the hole transport layer HTL, and the electron transport layer ETL may be disposed not only in the openings Oa, Ob, and Oc of the pixel defining layer PDL, but also on the pixel defining layer PDL outside the openings Oa, Ob, and Oc. The hole injection layer HIL, the hole transport layer HTL, and the electron transport layer ETL may also be disposed on the separation line SL, but may be separated at opposite sides of the separation line SL. In some examples, the hole injection layer HIL, the hole transport layer HTL, and/or the electron transport layer ETL may be omitted.

The emission layers LEa, LEb, and LEc may overlap the corresponding pixel electrodes E1a, E1b, and E1c in a plan view. The emission layers LEa, LEb, and LEc may be disposed (or positioned) in the corresponding openings Oa, Ob, and Oc of the pixel defining layer PDL. The emission layers LEa, LEb, and LEc may be separated from the emission layers LEa, LEb, and LEc of the neighboring pixels PXa, PXb, and PXc. The emission layers LEa, LEb, and LEc may not be disposed on the separation line SL. Each of the emission layers LEa, LEb, and LEc may include an organic material emitting light of a primary color represented by each of the pixels PXa, PXb, and PXc.

In each of the pixels PXa, PXb, and PXc, auxiliary layers ALa, ALb, and ALc may be disposed between the emission layers LEa, LEb, and LEc and the hole transport layer HTL. The thickness of the auxiliary layers ALa, ALb, and ALc may adjusts the length of a light path reciprocating between the pixel electrodes E1a, E1b, and E1c and the common electrode E2 to match the resonance conditions. At least some of the auxiliary layers ALa, ALb, and ALc, e.g., the auxiliary layer ALc of the third pixel PXc, may block electrons of the emission layer LEc from passing to the hole transport layer HTL. When the first pixel PXa represents red, the second pixel PXb represents green, and the third pixel PXc represents blue, auxiliary layer ALa may be the thickest and auxiliary layer ALc may be the thinnest. In some examples, the auxiliary layers ALa, ALb, and ALc may be omitted.

The second emission unit LUb may include the hole transport layer HTL, the emission layers LEa, LEb, and LEc, a buffer layer BUF, and the electron transport layer ETL.

The emission layers LEa, LEb, and LEc of the second emission unit LUb may have a same function and characteristics as those of the emission layers LEa, LEb, and LEc of the first emission unit LUa.

In each of the pixels PXa, PXb, and PXc, auxiliary layers ALa, ALb, and ALc may be disposed between the emission layers LEa, LEb, and LEc and the hole transport layer HTL. The auxiliary layers ALa, ALb, and ALc may have a same function and characteristic as those of the auxiliary layers ALa, ALb, and ALc of the first emission unit LUa.

Each of the hole transport layer HTL, the buffer layer BUF, and the electron transport layer ETL may be formed as a single layer over the pixels PXa, PXb, and PXc. For example, each of the hole transport layer HTL, the buffer layer BUF, and the electron transport layer ETL may be disposed not only in the openings Oa, Ob, and Oc of the pixel defining layer PDL, but also on the pixel defining layer PDL outside the openings Oa, Ob, and Oc. The hole transport layer HTL, the buffer layer BUF, and the electron transport layer ETL may also be disposed on the separation line SL, but may be separated at opposite sides of the separation line SL. The buffer layer BUF may include an insulating material. The buffer layer BUF and/or the electron transport layer ETL may be omitted.

A charge generating layer CGL may be disposed between the first emission unit LUa and the second emission unit LUb. The charge generating layer CGL may include an n-type charge generating layer n-CGL and a p-type charge generating layer p-CGL. In each of the pixels PXa, PXb, and PXc, the n-type charge generating layer n-CGL and the p-type charge generating layer p-CGL may contact each other to form an NP junction. Electrons and holes may be simultaneously generated between the n-type charge generating layer n-CGL and the p-type charge generating layer p-CGL by the NP junction. The generated electrons may be transferred to the first emission unit LUa through the n-type charge generating layer n-CGL, and the generated holes may be transferred to the second emission unit LUb through the p-type charge generating layer p-CGL. Conductivity of the n-type charge generating layer n-CGL may be lower than that of the p-type charge generating layer p-CGL.

The n-type charge generating layer n-CGL may be formed as a single layer over multiple pixels PXa, PXb, and PXc. The n-type charge generating layer n-CGL may be disposed not only in the openings Oa, Ob, and Oc of the pixel defining layer PDL, but also be disposed on the pixel defining layer PDL outside the openings Oa, Ob, and Oc. The n-type charge generating layer n-CGL may also be disposed on the separation line SL, but may be separated at opposite sides of the separation line SL.

The p-type charge generating layer p-CGL may be formed as a single layer over multiple pixels PXa, PXb, and PXc. The p-type charge generating layer p-CGL may be disposed not only in the openings Oa, Ob, and Oc of the pixel defining layer PDL, but also be disposed on the pixel defining layer PDL outside the openings Oa, Ob, and Oc. The p-type charge generating layer p-CGL may also be disposed on the separation line SL, but may be separated at opposite sides of the separation line SL.

In case that a single continuous n-type charge generating layer n-CGL is formed over the pixels PXa, PXb, and Pxc, when the display device is driven, a current of a pixel PXa, PXb, or PXc may flow through the continuous n-type charge generating layer n-CGL to the neighboring pixels PXa, PXb, and/or PXc, and unintended pixels may emit light, or may increase in luminance. In case that a single continuous p-type charge generating layer p-CGL is formed over the pixels PXa, PXb, and Pxc, when the display device is driven, a current of a pixel PXa, PXb, or PXc may flow through the continuous p-type charge generating layer p-CGL to the neighboring pixels PXa, PXb, and PXc, and unintended pixels may emit light, or may increase in luminance. The current flowing to the neighboring pixel through the n-type charge generating layer n-CGL and/or the p-type charge generating layer p-CGL and causing the neighboring pixel to emit light or increase in luminance is called a leakage emission. However, according to an embodiment, the n-type charge generating layer n-CGL and the p-type charge generating layer p-CGL may be separated by the separation line SL disposed on the insulating layer IL1 between the neighboring pixels PXa, PXb, and PXc. Accordingly, it is possible to reduce or prevent a current of a pixel from flowing through the n-type charge generating layer n-CGL and/or the p-type charge generating layer p-CGL to the neighboring pixels, and thus it may be possible to reduce or prevent leakage emissions.

Hereinafter, a manufacturing method of an emissive display device (for example, a display panel) according to an embodiment will be described.

FIG. 5 to FIG. 10 illustrate schematic process cross-sectional views showing a manufacturing method of an emissive display device according to an embodiment.

Figure 5:
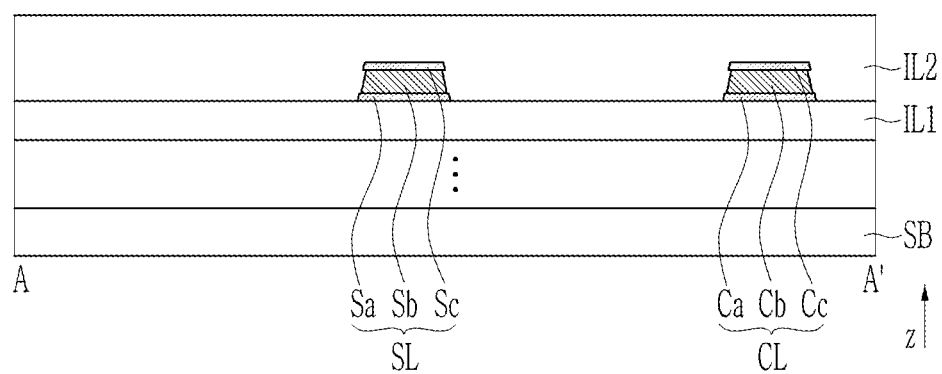
FIG. 5 to FIG. 10 illustrate schematic process cross-sectional views showing a manufacturing method of an emissive display device according to an embodiment.

Referring to FIG. 5, the insulating layer IL1 may be formed on the substrate SB. After a conductive material layer is formed on the insulating layer IL1, the separation line SL and the connector CL may be formed by patterning the insulating layer IL1. Patterning may indicate forming a selected pattern by removing a portion of the layer through a photolithography process or the like. The separation line SL and the connector CL which are initially formed may have a different structure from their final structures. The separation line SL and the connector CL may be multi-layered, for example, may have a triple-layer structure of titanium (Ti)/aluminum (Al)/titanium (Ti) or molybdenum (Mo)/aluminum (Al)/titanium (Ti). Insulating layer IL2 may cover the separation line SL and the connector CL disposed on insulating layer IL1. In an example, insulating layer IL2 may be formed by coating a photosensitive polyimide (PSPI).

Figure 6:
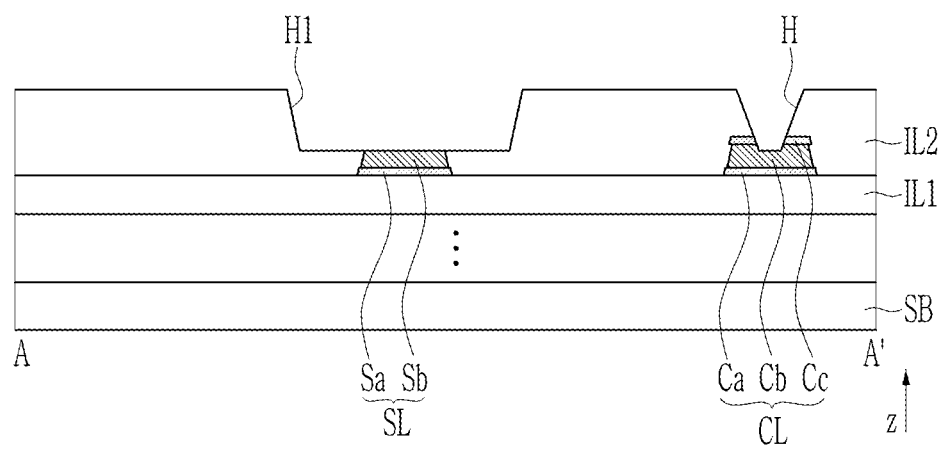

Referring to FIG. 6, the insulating layer IL2 may be patterned by selectively irradiating and developing the layer with light using a photomask. The insulating layer IL2 may be cured. A portion of the insulating layer IL2 overlapping the separation line SL and the connector CL may be removed by patterning the insulating layer IL2. A contact hole H overlapping the connector CL may be formed in the insulating layer IL2 by patterning the insulating layer IL2. Portions of the insulating layer IL2 disposed at opposite sides of the separation line SL may be removed to form a hole H1 overlapping the separation line SL. The hole H1 may be formed to have an elongated trench shape along a longitudinal direction of the separation line SL. When the insulating layer IL2 is patterned, an entire uppermost layer Sc of the separation line SL and a portion of an uppermost layer Cc of the connector CL may be removed. Since a surface of an intermediate layer Sb of the separation line SL is etched, a thickness of the intermediate layer Sb may be reduced. The insulating layer IL2 disposed (or positioned) on the opposite sides of the separation line SL may not be completely removed in the third direction z, but may remain to have a thickness approximately equal to the thickness of the separation line SL from which the uppermost layer has been removed. At this point in the process, the sides of the separation line SL may not be exposed.

Figure 7:
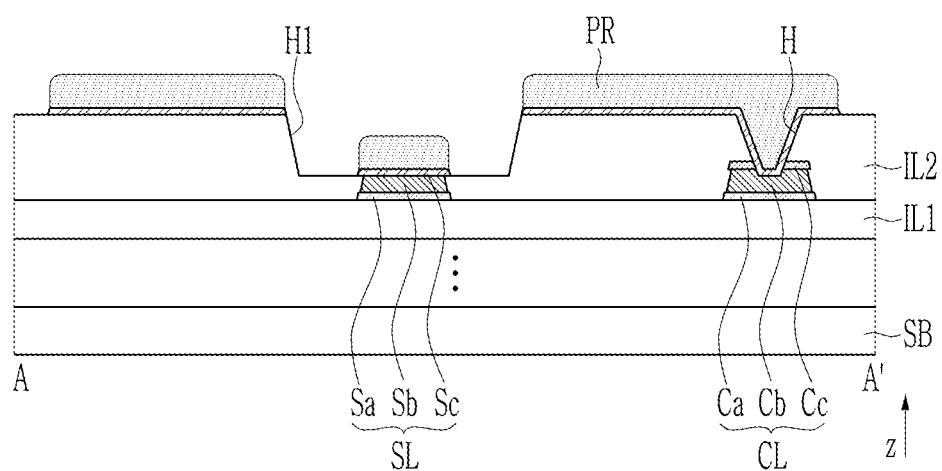

Referring to FIG. 7, a conductive material layer is formed on the insulating layer IL2 and then patterned to form the pixel electrodes E1a, E1b, and E1c and the third conductive layer Sc of the separation line SL. The patterning of the conductive material layer will be described here in more detail. After applying (e.g., coating) a photoresist on a conductive material layer, selectively irradiating light using a photomask, and developing it to form a photoresist pattern PR, the pixel electrodes E1a, E1b, and E1c and the third conductive layer Sc may be formed by wet-etching the conductive material layer using the photoresist pattern PR as a mask. Accordingly, the third conductive layer Sc of the separation line SL and the pixel electrodes E1a, E1b, and E1c may be include a same material and may be formed in a same process.

Figure 8:
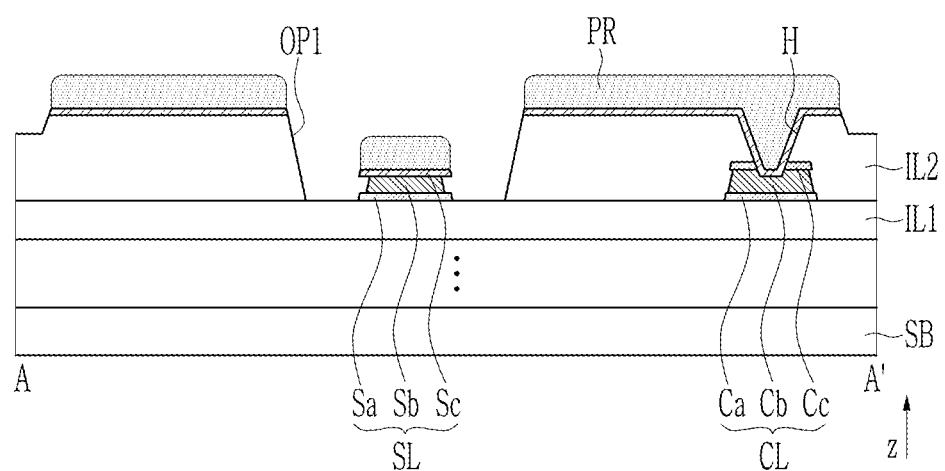

Referring to FIG. 8, the insulating layer IL2 disposed (or positioned) on opposite sides of the separation line SL may be completely removed by performing dry-etching using the photoresist pattern PR as a mask, and the opening OP1 overlapping the separation line SL may be formed. The side surfaces of the second conductive layer Sb of the separation line SL may be etched together to reduce a width of the second conductive layer Sb, and the separation line SL may have a reverse tapered structure.

Figure 9:
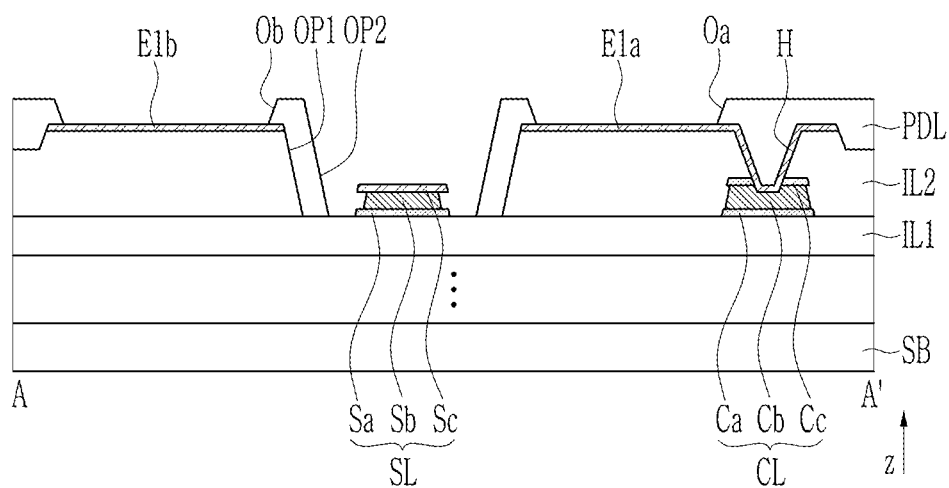

Referring to FIG. 9, the photoresist pattern PR is stripped, the insulating material layer is coated, and the pixel defining layer PDL having the openings Oa, Ob, and Oc overlapping the pixel electrodes E1a, E1b, and E1c and the opening OP2 overlapping the separation line SL may be formed.

Figure 10:
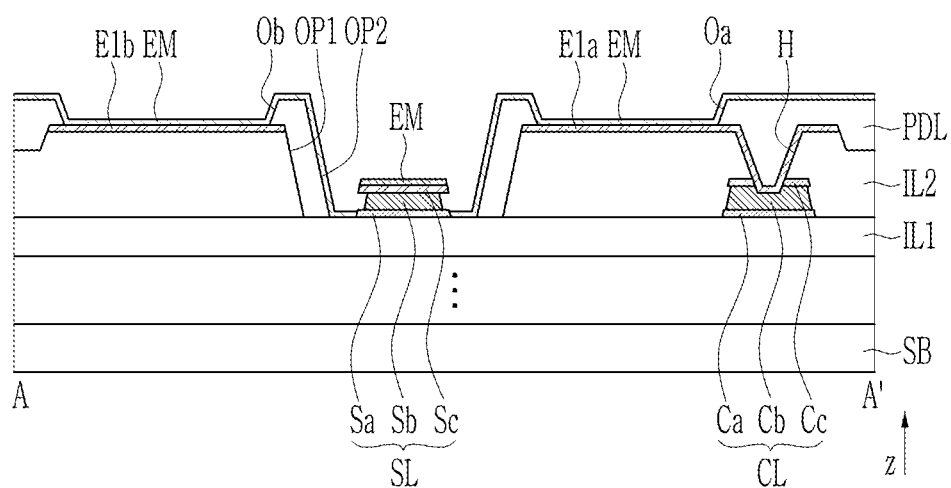

Referring to FIG. 10, the emission member EM may be formed on the pixel electrodes E1a, E1b, and E1c, the separation line SL, and the pixel defining layer PDL. In the emission member EM, the emission layers LEa, LEb, and LEc and the auxiliary layers ALa, ALb, and ALc may be selectively deposited in regions corresponding to the respective pixels PXa, PXb, and PXc by using a fine metal mask. Accordingly, the emission layers LEa, LEb, and LEc and the auxiliary layers ALa, ALb, and ALc may not be disposed on the separation line SL positioned between the neighboring pixels PXa, PXb, and PXc. In the emission member EM, a charge generating layer CGL, the hole injection layer HIL, the hole transport layer HTL, the electron transport layer ETL, and the buffer layer BUF may be deposited over the entire display area DA using an open mask. Accordingly, the charge generating layer CGL, the hole injection layer HIL, the hole transport layer HTL, the electron transport layer ETL, and the buffer layer BUF may be disposed on the separation line SL, but may be separated at opposite sides of the separation line SL due to the reverse tapered structure of the separation line SL when those layers are deposited. Accordingly, current leakage between the adjacent pixels PXa, PXb, and PXc by the charge generating layer CGL and leakage emission due to the current leakage may be reduced or prevented. The disconnected charge generation layer CGL (and also the other layers of the emission layer EM) may contact a side surface of the first conductive layer Sa of the separation line SL and be electrically connected through the first conductive layer Sa with the change generation layer CGL separated on the other side of the separation line SL. However, the first conductive layer Sa may have a higher specific resistance and may be thinner than the second conductive layer Sb, and thus any leakage current through the first conductive layer Sa of the separation line SL may be insignificant. The reverse tapered structure of the separation line SL for separating the emission member EM, (for example, the charge generating element CGL of the emission member EM), may be formed by dry-etching without adding a mask after wet-etching to form the pixel electrodes E1a, E1b, and E1c and the third conductive layer Sc.

The common electrode E2 may be formed on the emission member EM (refer to FIG. 3). The common electrode E2 may be deposited over the entire display area DA using an open mask. Therefore, the common electrode E2 may be disposed on the separation line SL, but may be disconnected at opposite sides of the separation line SL due to the reverse tapered structure of the separation line SL when the common electrode E2 is deposited.

Figure 11:
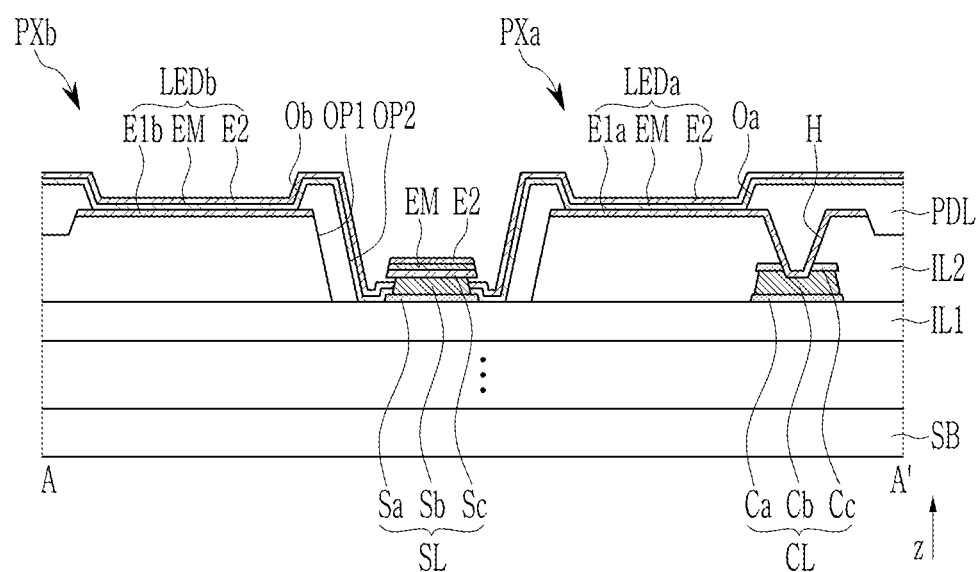
FIG. 11 and FIG. 12 each illustrate a schematic cross-sectional view of an emissive display device taken along line A-A' in FIG. 2 according to an embodiment.
Figure 12:
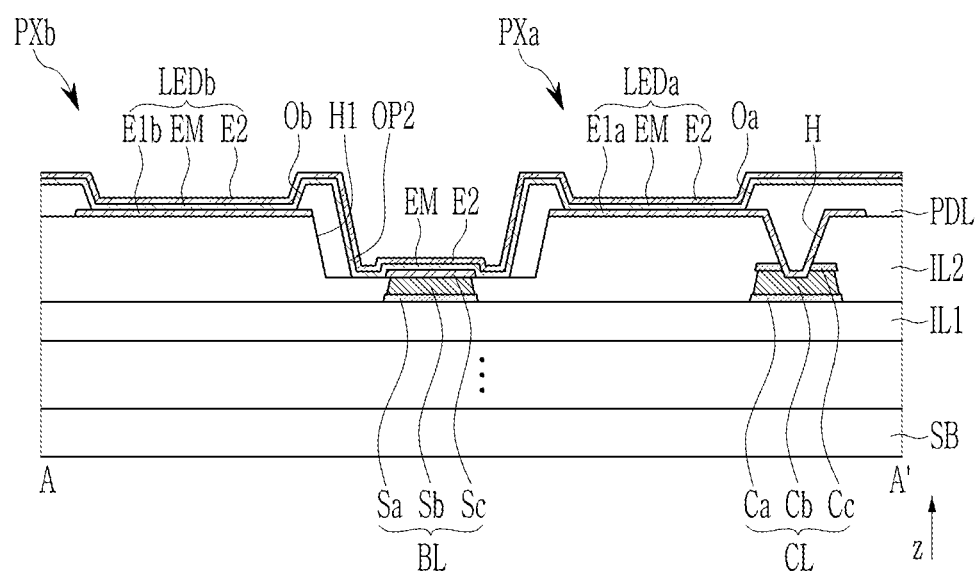

FIG. 11 and FIG. 12 each illustrate a cross-sectional view of an emissive display device taken along line A-A' in FIG. 2 according to an embodiment.

Referring to FIG. 11, similarly to the embodiment illustrated in FIG. 3, the emission member EM and the common electrode E2 are separated at opposite sides of the separation line SL by the reverse tapered structure of the separation line SL. However, unlike the embodiment illustrated in FIG. 3, the common electrode E2 is connected to the second conductive layer Sb of the separation line SL. For example, the common electrode E2 is in contact with a side surface of the second conductive layer Sb, which may be formed thickly and low in resistivity. Such a structure may be formed by obliquely depositing the common electrode E2 or using a thickness difference between deposited layers, for example. When a common voltage is applied to the separation line SL, the common voltage may be applied to the common electrode E2 through the separation line SL over the entire display area DA, so a voltage drop due to resistance of the common electrode E2 may be improved.

The emission member EM, particularly the charge generating layer CGL, may contact a side surface of the second conductive layer Sb as illustrated in FIG. 11, but the embodiments are not limited thereto. In other examples, the emission member EM may not contact the second conductive layer Sb. When the emission member EM contacts the side surface of the second conductive layer Sb, the disconnected charge generation layer CGL may be electrically connected through the second conductive layer Sb, so a leakage current through the charge generating layer CGL may be generated between the adjacent pixels PXa, PXb, and PXc. However, a current leaking through the charge generating layer CGL may be bypassed through the separation line SL when a voltage, such as a common voltage, is applied to the separation line SL.

Referring to FIG. 12, a bypass line BL is disposed between the neighboring pixels PXa, PXb, and PXc, similar to the separation line SL of the above-described embodiments. The bypass line BL may have substantially the same stacked structure as that of the separation line SL. The insulating layer IL2 may not cover an upper surface of the bypass line BL, and may have a hole H1 overlapping the bypass line BL. In the vicinity of the bypass line BL, a thickness of the insulating layer IL2 may be equal to or substantially equal to a thickness of the first conductive layer Sa and the second conductive layer Sb of the bypass line BL. The pixel defining layer PDL may have an opening OP2 overlapping the bypass line BL. A width of the opening OP2 may be wider than that of the bypass line BL and may be narrower than a width of the hole H1.

The emission member EM and the common electrode E2 are continuously formed between the neighboring pixels PXa, PXb, and PXc without being separated by the bypass line BL. A surface of the emission member EM may contact a surface of the third conductive layer Sc of the bypass line BL. Such a structure may be formed by forming the pixel defining layer PDL without dry-etching after wet-etching to form the pixel electrodes E1a, E1b, and E1c and the third conductive layer Sc, in the above-described manufacturing method, for example the process illustrated in FIG. 8 may be omitted.

Since the light emitting member EM is not separated by the bypass line BL and is connected between the adjacent pixels PXa, PXb, and PXc, and is continuously formed over the pixel electrodes E1a, E1b, and E1c, a current may leak through the charge generating layer CGL. However, since a surface of the emission member EM may contact the bypass line BL, when a voltage, such as a common voltage, is applied to the bypass line BL, a current leaking through the charge generating layer CGL may be bypassed through the bypass line BL.

Figure 13:
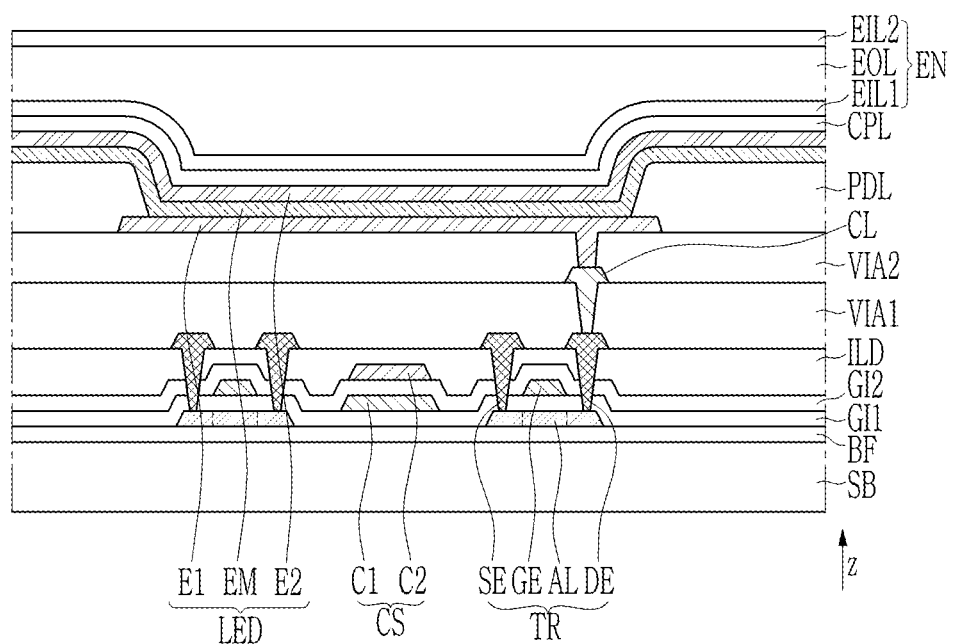
FIG. 13, FIG. 14, and FIG. 15 each illustrate a schematic cross-sectional view of a pixel area in a display panel according to an embodiment.
Figure 14:
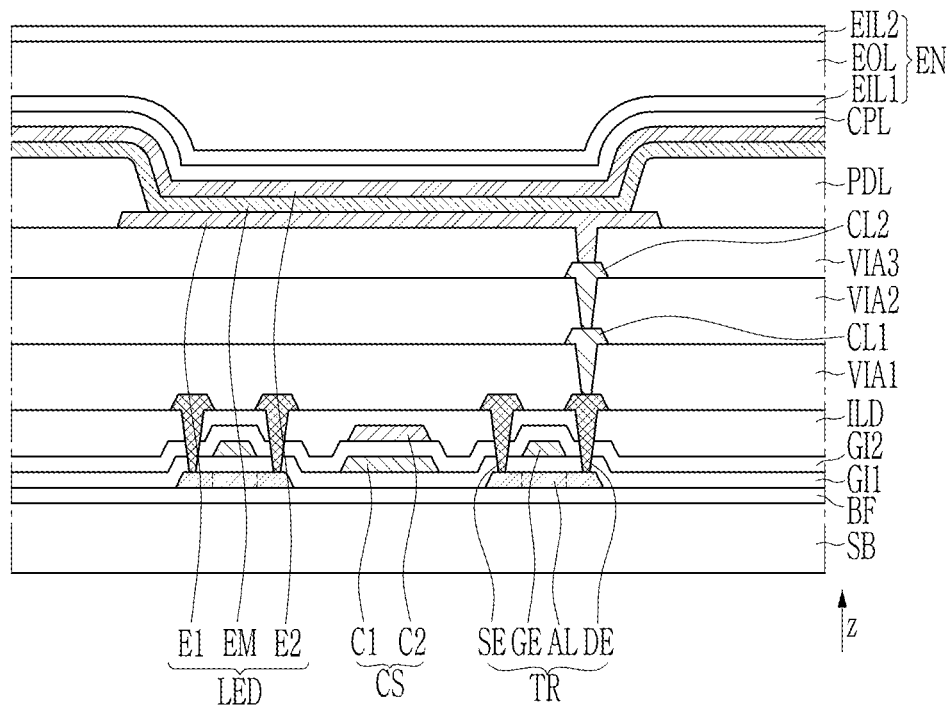
Figure 15:
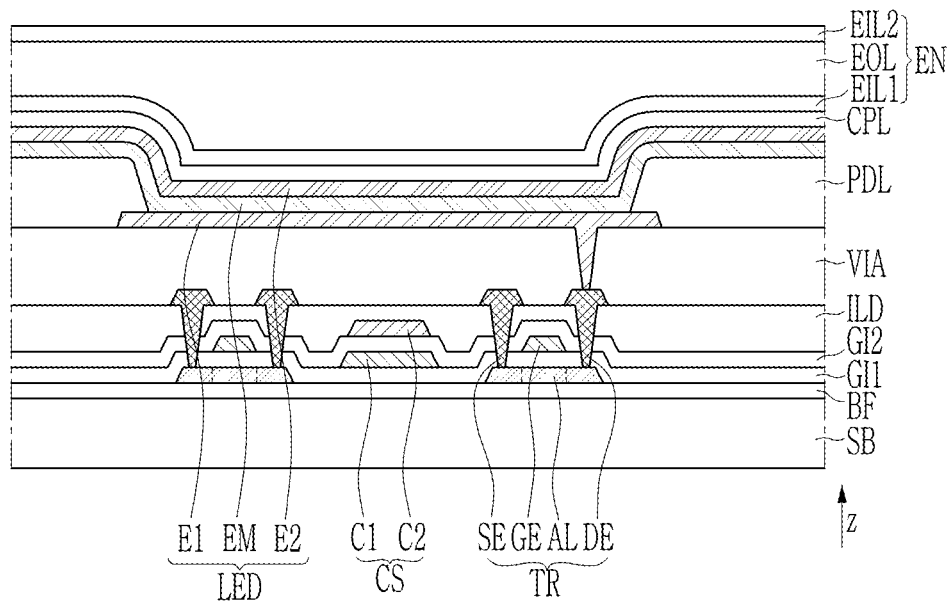

FIG. 13, FIG. 14, and FIG. 15 each illustrate a schematic cross-sectional view of a pixel area in a display panel according to an embodiment.

FIG. 13 illustrates a schematic cross-sectional view showing a stacked structure of a display panel according to an embodiment. The cross-section illustrated in FIG. 13 may correspond to approximately one of the pixel areas.

The display panel may include a substrate SB, a transistor TR formed on the substrate SB, and a light emitting diode LED connected to the transistor TR. The light emitting diode LED may correspond to the pixel PX. In FIG. 13, elements disposed between the substrate SB and the first planarization layer VIA1 may correspond to elements omitted from the illustrations between the substrate SB and the first insulating layer IL1 in FIG. 3, FIG. 11, and FIG. 12.

The substrate SB may be made of a material such as glass. The substrate SB may be a flexible substrate including a polymer resin such as polyimide, polyamide, or polyethylene terephthalate.

A buffer layer BF may be disposed on the substrate SB. The buffer layer BF may improve the characteristics of the semiconductor layer by blocking impurities from the substrate SB when the semiconductor layer is formed, and may flatten a surface of the substrate SB to relieve a stress of the semiconductor layer. The buffer layer BF may include an inorganic insulating material such as a silicon nitride ($SiN_x$), a silicon oxide ($SiO_x$), and a silicon oxynitride ($SiO_xN_y$), and may be a single layer or multiple layers. The buffer layer BF may include amorphous silicon (Si).

A semiconductor layer AL of a transistor TR may be disposed on the buffer layer BF. The semiconductor layer AL may include a first region and a second region, and a channel region therebetween. The semiconductor layer AL may include any one of amorphous silicon, polysilicon, and an oxide semiconductor. For example, the semiconductor layer AL may include low temperature polysilicon (LTPS), and may include an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be disposed on the semiconductor layer AL. The first gate insulating layer GI1 may include an inorganic insulating material such as a silicon nitride, a silicon oxide, and a silicon oxynitride, and may be a single layer or multiple layers.

The first gate conductive layer, which may include a gate electrode GE of the transistor TR, and a first electrode C1 of a capacitor CS, may be disposed on the first gate insulating layer GI1. The first gate conductive layer may include molybdenum (Mo), aluminum (Al), copper (Cu), titanium (Ti), and the like, and may be a single layer or multiple layers.

A second gate insulating layer GI2 may be disposed on the first gate conductive layer. The second gate insulating layer GI2 may include an inorganic insulating material such as a silicon nitride, a silicon oxide, and a silicon oxynitride, and may be a single layer or multiple layers.

A second gate conductive layer that may include a second electrode C2 of the capacitor CS and the like may be disposed on the second gate insulating layer GI2. The second gate conductive layer may include molybdenum (Mo), aluminum (Al), copper (Cu), titanium (Ti), and the like, and may be a single layer or multiple layers.

An interlayer insulating layer ILD may be disposed on the second gate insulating layer GI2 and the second gate conductive layer. The interlayer insulating layer ILD may include an inorganic insulating material such as a silicon nitride, a silicon oxide, and a silicon oxynitride, and may be a single layer or multiple layers.

A first data conductive layer that may include a first electrode SE and a second electrode DE and the like of the transistor TR may be disposed on the interlayer insulating layer ILD. The first electrode SE and the second electrode DE may be respectively electrically connected to a first region and a second region of the semiconductor layer AL through contact holes formed in the insulating layers GI1, GI2, and ILD. The first electrode SE or the second electrode DE may serve as a source electrode, and the other may serve as a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the first data conductive layer may include a lower layer including a refractory metal such as molybdenum, chromium, tantalum, or titanium, an intermediate layer including a metal having low resistivity such as aluminum, copper, or silver, and an upper layer including a refractory metal. For example, the third conductive layer may have a triple-layer structure such as titanium (Ti)/aluminum (Al)/titanium (Ti).

A first planarization layer VIA1 may be disposed on the first data conductive layer. The first planarization layer VIA1 may be an organic insulating layer. For example, the first planarization layer VIA1 may include an organic insulating material such as a general purpose polymer such as poly (methylmethacrylate) and polystyrene, a polymer derivative having a phenolic group, an acrylic polymer, an imide-based polymer (e.g., polyimide), and a siloxane-based polymer. The first insulating layer IL1 illustrated in FIG. 3, FIG. 11, and FIG. 12 may correspond to the first planarization layer VIA1.

A second data conductive layer, which may include a connector CL and the like may be disposed on the first planarization layer VIA1. The connector CL may be electrically connected to the second electrode DE of the transistor TR through a contact hole formed in the first planarization layer VIA1. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the second data conductive layer may have a triple-layer structure of, e.g., titanium (Ti)/aluminum (Al)/titanium (Ti).

A second planarization layer VIA2 may be disposed on the second data conductive layer. The second planarization layer VIA2 may be an organic insulating layer. For example, the second planarization layer VIA2 may contain an organic insulating material such as a general purpose polymer such as poly(methylmethacrylate) or styrene, a polymer derivative having a phenolic group, an acrylic polymer, an imide-based polymer, and a siloxane-based polymer. The second insulating layer IL2 illustrated in FIG. 3, FIG. 11, and FIG. 12 may correspond to the second planarization layer VIA2.

The pixel electrode E1 of the light emitting diode LED is disposed on the second planarization layer VIA2. The pixel electrode E1 may be connected to the connector CL through a contact hole formed in the second planarization layer VIA2. Accordingly, the pixel electrode E1 may be electrically connected to the second electrode DE of the transistor TR to receive a driving current for controlling brightness of the light emitting diode LED. The transistor TR to which the pixel electrode E1 is connected may be a driving transistor or a transistor that is electrically connected to the driving transistor. The pixel electrode E1 may be formed of a reflective conductive material or a translucent conductive material, or may be formed of a transparent conductive material. The pixel electrode E1 may include a transparent conductive material such as an indium tin oxide (ITO) or an indium zinc oxide (IZO). The pixel electrode E1 may include a metal such as lithium (Li), calcium (Ca), aluminum (Al), silver (Ag), magnesium (Mg), or gold (Au), or a metal alloy. The pixel electrode E1 may have a multi-layered structure, and may have a triple-layer structure of, e.g., ITO-silver (Ag)-ITO.

A pixel definition layer PDL, which may be an organic insulating layer, may be disposed on the second planarization layer VIA2. The pixel defining layer PDL may have an opening overlapping the pixel electrode E1.

The emission member EM of the light emitting diode LED may be disposed on the pixel electrode E1, and the common electrode E2 of the light emitting diode LED may be disposed on the emission member EM. The common electrode E2 may be made of a low work function metal such as calcium (Ca), barium (Ba), magnesium (Mg), aluminum (Al), silver (Ag), or a metal alloy, as a thin layer to have light transmittance. The common electrode E2 may include a transparent conductive oxide such as an indium tin oxide (ITO) or an indium zinc oxide (IZO). A common voltage may be applied to the common electrode E2.

The pixel electrode E1, the emission member EM, and the common electrode E2 of each pixel PX form a light emitting diode LED such as an organic light emitting diode or an inorganic light emitting diode. The pixel electrode E1 may be an anode of the light emitting diode LED, and the common electrode E2 may be a cathode of the light emitting diode LED.

A capping layer CPL may be disposed on the common electrode E2. The capping layer CPL may increase light efficiency by adjusting a refractive index. The capping layer CPL may be disposed to entirely cover the common electrode E2. The capping layer CPL may include an organic insulating material, or may include an inorganic insulating material.

An encapsulation layer EN may be disposed on the capping layer CPL. The encapsulation layer EN may encapsulate a light emitting diode LED to prevent moisture or oxygen from penetrating from the outside. The encapsulation layer EN may be a thin film encapsulation layer including one or more inorganic layers EIL1 and EIL2 and one or more organic layers EOL.

A touch sensor layer (not illustrated) including touch electrodes may be disposed on the encapsulation layer EN. The touch electrodes may have a mesh shape having an opening overlapping the light emitting diode LED. An anti-reflection layer (not illustrated) for reducing external light reflection may be disposed on the touch sensor layer.

In the display panel according to the embodiment of FIG. 14, a third planarization layer VIA3 and a third data conductive layer including a second connector CL2 are further disposed on the second planarization layer VIA2 compared with the embodiment illustrated in FIG. 13. The second connector CL2 may be electrically connected to a first connector CL1 corresponding to the connector CL illustrated in FIG. 13 through a contact hole formed in the second planarization layer VIA2, and the pixel electrode E1 may be electrically connected to the second connector CL2 through a contact hole formed in the third planarization layer VIA3. The third data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the second data conductive layer may have a triple layer structure of, e.g., titanium/aluminum/titanium (Ti/Al/Ti). The third planarization layer VIA3 may be an organic insulating layer. For example, the third planarization layer VIA3 may contain an organic insulating material such as a general purpose polymer such as poly(methyl methacrylate) or styrene, a polymer derivative having a phenolic group, an acrylic polymer, an imide-based polymer, and a siloxane-based polymer.

In FIG. 14, the elements disposed between the substrate SB and the second planarization layer VIA2 may correspond to elements omitted in the illustration between the substrate SB and the first insulating layer IL1 in FIG. 3, FIG. 11, and FIG. 12. The first insulating layer IL1, the second insulating layer IL2, and the connector CL illustrated in FIG. 3, FIG. 11, and FIG. 12 may correspond to the second planarization layer VIA2, the third planarization layer VIA3, and the second connector CL2, respectively.

The display panel illustrated in FIG. 15 does not include the second planarization layer VIA2 and a second data conductive layer, compared to the embodiment illustrated in FIG. 13. The pixel electrode E1 may be connected to the second electrode DE of the transistor TR through a contact hole formed in a planarization layer VIA corresponding to the first planarization layer VIA1 illustrated in FIG. 13.

In FIG. 15, elements disposed between the substrate SB and the planarization layer VIA may correspond to the elements omitted in the illustrations of portions between the substrate SB and the first insulating layer IL1 in FIG. 3, FIG. 11, and FIG. 12. The first insulating layer IL1, the second insulating layer IL2, and the connector CL illustrated in FIG. 3, FIG. 11, and FIG. 12 may correspond to the interlayer insulating layer ILD, the planarization layer VIA, and the second electrode DE, respectively.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An emissive display device comprising:
a transistor disposed on a substrate;
a first insulating layer disposed on the transistor;
a separation line disposed on the first insulating layer, the separation line being made of an electrically conductive material;
a second insulating layer disposed on the first insulating layer, the second insulating layer including a first opening overlapping the separation line in a plan view;
a first pixel electrode and a second pixel electrode disposed at opposite sides of the separation line, the first pixel electrode and the second pixel electrode being disposed on the second insulating layer;
a pixel defining layer disposed on the second insulating layer, the pixel defining layer including a second opening overlapping the separation line in the plan view;
an emission member disposed on the first pixel electrode, the second pixel electrode, the pixel defining layer, and the separation line, the emission member being separated by the separation line; and
a common electrode disposed on the emission member, the common electrode being separated by the separation line with separated portions of the common electrode fully exposing the separation line, wherein
the emission member includes:
a first emission unit;
a charge generating layer disposed on the first emission unit; and a second emission unit disposed on the charge generating layer.

2. The emissive display device of claim 1, wherein
the charge generating layer includes an n-type charge generating layer and a p-type charge generating layer, and
the charge generating layer is separated at opposite sides of the separation line.

3. The emissive display device of claim 2, wherein the charge generating layer has a portion disposed on the separation line.

4. The emissive display device of claim 3, wherein the separation line includes:
a first conductive layer;
a second conductive layer; and a third conductive layer,
the first conductive layer, the second conductive layer, and the third conductive layer are sequentially stacked, and
the charge generating layer electrically contacts a side surface of the first conductive layer.

5. The emissive display device of claim 4, wherein the charge generating layer electrically contacts a side surface of the second conductive layer.

6. The emissive display device of claim 1, wherein the separation line includes:
a first conductive layer;
a second conductive layer made of a metal; and
a third conductive layer,
the first conductive layer, the second conductive layer and the third conductive layer are sequentially stacked, and
a width of the third conductive layer is greater than a width of the second conductive layer.

7. The emissive display device of claim 6, wherein the third conductive layer includes a transparent conductive oxide layer.

8. The emissive display device of claim 6, wherein the third conductive layer includes:
a first transparent conductive oxide layer;
a metal layer; and
a second transparent conductive oxide layer, and
the first transparent conductive oxide layer, the metal layer, and the second transparent conductive oxide layer are sequentially stacked.

9. The emissive display device of claim 6, wherein the third conductive layer, the first pixel electrode, and the second pixel electrode include a same material, and are formed in a same process.

10. The emissive display device of claim 6, further comprising:
a connector disposed on the first insulating layer, the connector being an electrode of the transistor, or the connector being electrically connected to the electrode of the transistor, wherein
the connector includes a first conductive layer, a second conductive layer, and a third conductive layer,
the first conductive layer of the connector, the second conductive layer of the connector, and the third conductive layer of the connector are sequentially stacked,
the first conductive layer of the separation line and the second conductive layer of the separation line, and the first conductive layer of the connector and the second conductive layer of the connector include a same material, and the third conductive layer of the separation line and the third conductive layer of the connector include a different material.

11. The emissive display device of claim 10, wherein the second conductive layer of the separation line is thinner than the second conductive layer of the connector.

12. The emissive display device of claim 10, wherein
the pixel defining layer has an opening overlapping the connector in the plan view, and
the first pixel electrode is connected to the connector through the opening of the pixel defining layer.

13. The emissive display device of claim 1, wherein each of the first emission unit and the second emission unit includes:
a hole transport layer;
an electron transport layer disposed on the hole transport layer;
a first emission layer overlapping the first pixel electrode in the plan view, the first emission layer disposed between the hole transport layer and the electron transport layer; and
a second emission layer overlapping the second pixel electrode in the plan view, the second emission layer disposed between the hole transport layer and the electron transport layer.

14. The emissive display device of claim 1, wherein the separation line includes:
a first conductive layer;
a second conductive layer; and a third conductive layer,
the first conductive layer, the second conductive layer, and the third conductive layer are sequentially stacked, and
the common electrode electrically contacts a side surface of the second conductive layer.

15. The emissive display device of claim 1, wherein the common electrode has a portion disposed on the separation line.

16. An emissive display device comprising:
a transistor disposed on a substrate;
a first insulating layer disposed on the transistor;
a separation line disposed on the first insulating layer;
a second insulating layer disposed on the first insulating layer, the second insulating layer including a first opening overlapping the separation line in a plan view;
a first pixel electrode and a second pixel electrode disposed at opposite sides of the separation line, the first pixel electrode and the second pixel electrode being disposed on the second insulating layer;
a pixel defining layer disposed on the second insulating layer, the pixel defining layer including a second opening overlapping the separation line in the plan view;
an emission member disposed on the first pixel electrode, the second pixel electrode, the pixel defining layer, and the separation line, the emission member being separated by the separation line;
the emission member includes:
a first emission unit;
a charge generating layer disposed on the first emission unit; and a second emission unit disposed on the charge generating layer,
wherein the separation line includes:
a first conductive layer;
a second conductive layer made of a metal; and
a third conductive layer,
the first conductive layer, the second conductive layer and the third conductive layer are sequentially stacked, and
a width of the third conductive layer is greater than a width of the second conductive layer,
wherein the emissive display device further comprises:
further comprising:
a connector disposed on the first insulating layer, the connector being an electrode of the transistor, or the connector being electrically connected to the electrode of the transistor, wherein
the connector includes a first conductive layer, a second conductive layer, and a third conductive layer,
the first conductive layer of the connector, the second conductive layer of the connector, and the third conductive layer of the connector are sequentially stacked,
the first conductive layer of the separation line and the second conductive layer of the separation line, and the first conductive layer of the connector and the second conductive layer of the connector include a same material, and
the third conductive layer of the separation line and the third conductive layer of the connector include a different material, and
wherein the second conductive layer of the separation line is thinner than the second conductive layer of the connector.

17. The emissive display device of claim 16, wherein
the charge generating layer includes an n-type charge generating layer and a p-type charge generating layer, and
the charge generating layer is separated at opposite sides of the separation line.

18. The emissive display device of claim 17, wherein the charge generating layer has a portion disposed on the separation line.

19. The emissive display device of claim 18, wherein the separation line includes:
a first conductive layer;
a second conductive layer; and a third conductive layer,
the first conductive layer, the second conductive layer, and the third conductive layer are sequentially stacked, and
the charge generating layer electrically contacts a side surface of the first conductive layer.

20. The emissive display device of claim 16, wherein the third conductive layer includes a transparent conductive oxide layer.

* * * * *